(12) United States Patent
Przybysz et al.

(10) Patent No.: US 7,359,694 B2
(45) Date of Patent: Apr. 15, 2008

(54) CARBON NANOTUBE DEVICES AND METHOD OF FABRICATING THE SAME

(75) Inventors: John Xavier Przybysz, Severna Park, MD (US); John Douglas Adam, Millersville, MD (US); Hong Zhang, Gambrills, MD (US); Howard Fudem, Baltimore, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 574 days.

(21) Appl. No.: 11/012,864

(22) Filed: Dec. 16, 2004

(65) Prior Publication Data

US 2006/0135110 A1    Jun. 22, 2006

(51) Int. Cl.
*H04B 1/26* (2006.01)
(52) U.S. Cl. ........................ 455/323; 455/333
(58) Field of Classification Search ............... None
See application file for complete search history.

(56) References Cited

U.S. PATENT DOCUMENTS

| 2002/0014999 | A1 | 2/2002 | Crowley |
| 2005/0282515 | A1* | 12/2005 | Bertin .................. 455/334 |
| 2006/0261433 | A1* | 11/2006 | Manohara et al. .......... 257/471 |
| 2007/0281657 | A1* | 12/2007 | Brommer et al. .......... 455/334 |

FOREIGN PATENT DOCUMENTS

| EP | 0 917 283 A2 | 5/1999 |
| WO | WO 01/03208 A1 | 1/2001 |

OTHER PUBLICATIONS

Avouris, P. et al. "Carbon Nanotube Electronics", International Electron Devices Meeting 2002, Technical Digest, pp. 281-284.
Kawazoe, Yoshiyuki, "How Ab initio Computer Simulation can Predict Materials Properties before Experiment", Intelligent Processing and Manufacturing of Materials, 1999, pp. 355-359.
Peter H. Siegel, Terahertz Technology, IEEE Transactions on Microwave Theory and Technique, Mar. 2002, p. 910-928, vol. 50, No. 3.
Chin Li Cheung, Andrea Kurtz, Hongkun Park, and Charles M. Lieber, Diameter-Controlled Synthesis of Carbon Nanotubes, J. Phys. Chem. B, Feb. 16, 2002. p. 2429-2433, 106, Web.
Marc Bockrath, J. Hone, A . Zettl, and Paul L. McEuen, Chemical Doping of Individual Semiconducting Carbon-Nanotube Ropes; Rapid Communications Physical Review B, R10 606-R10-608, Apr. 15, 2000, vol. 61, No. 16, The American Physical Society.

(Continued)

*Primary Examiner*—Thanh Cong Le
(74) *Attorney, Agent, or Firm*—Rothwell, Figg, Ernst & Manbeck

(57) ABSTRACT

An RF mixer includes a diode quad including first, second, third and fourth carbon nanotube diodes, each carbon nanotube diode including a p-n junction The mixer also includes a RF input coupled each of the diodes, and a local oscillator input coupled with each of the diodes.

9 Claims, 14 Drawing Sheets

OTHER PUBLICATIONS

V. Derycke, R. Martel, J. Appenzeller and Ph Avouris, Carbon Nanotube Inter- and Intramolecular Logic Gates, Nano Letters, Aug. 16, 2001, p. A-D, vol. 0, No. 0.

Chongwu Zhou, Jing Kong, Erhan Yenilmez, Hongjie Dai, Modulated Chemical Doping of Individual Carbon Nanotubes, Science Magazine, Nov. 24, 2000, p. 1552-1555, www.sciencemag.org.

R. S. Lee, H. J. Kim, J. E. Fischer, A. Thess and R. E. Smalley, Conductivity Enhancement in Single-walled Carbon Nanotube Bundles Doped with K and Br, Nature, Jul. 17, 1997, p. 255-257, vol. 388.

T. Dürkop, S. A. Getty, Enrique Cobas, and M. S. Fuhrer, Extraordinary Mobility in Semiconducting Carbon Nanotubes, Nano Letters, Dec. 3, 2003, p. 35-39, vol. 4, No. 1, 2004 American Chemical Society.

Ali Javey, Jing Guo, Qian Wang, Mark Lundstrom and Hongjie Dai, Ballistic Carbon Nanotube Field-effect Transistors, Nature, Aug. 2003, p. 654-657, vol. 424, www.nature.com/nature.

Y. Yaish, J.-Y. Park, S. Rosenblatt, V. Sazonova, M. Brink, and P. L. McEuen, Electrical Nanoprobing of Semiconducting Carbon Nanotubes Using an Atomic Force Microscope, Unrelated, Cornell University, 2002, p. 1-4.

David H. Cobden, Marc Bockrath, and Paul L. McEuen, Spin Splitting and Even-odd Effects in Carbon Nanotubes, Physical Review Letters, Jul. 20, 1998, p. 681-684, vol. 81, No. 3, The American Physical Society.

B. Nabet, E. Gallo, M. Freitag, A. T. Johnson, and X. Chen, Local Variation of Metal-semiconducting Carbon Nanotube Contact Barrier Height, IEEE-Nano 2002, Aug. 28, 2002, p. 435-438, IEEE.

A. S. Vedeneev, J. Li, C. Papadopoulos, A. Rakitin, A. J. Bennett, H. W. Chik and J. M. Xu, Molecular-scale Rectifying Diodes Based on Y-junction Carbon Nanotubes, IEEE, 1999, p. 9.5.1-9.5.3.

Phaedon Avouris, Joerg Appenzeller, Richard Martel, and Shalom J. Wind, Carbon Nanotube Electronics, Invited Paper, Nov. 11, 2003, p. 1172-1784, vol. 91, No. 11, Proceedings of the IEEE.

Donald D. King, Passive Detective, p. 1-34, Phillips Laboratories.

I. Mehdi, T.H. Lee, D.A. Humphrey, S.C. Martin, R.J. Dengler, J. E. Oswald, A. Pease, R. P. Smith and P. H. Seigel, 600 Ghz Planar-Schottky-Diode Subharmonic Waveguide Mixers, Jet Propulsion Laboratory California Institute of Technology, IEEE, Jun. 1996, p. 377-380, IEEE MTT-S Digest.

N. R. Franklin and H. Dai, An Enhanced CVD Approach to Extensive Nanotube Networks with Directionality, Advanced Materials, Mar. 28, 2000, p. 890-894, vol. 12, No. 12.

Shaoming Huang, Xinyu Cai and Jie Liu, Growth of Millimeter-long and Horizontally Aligned Single-walled Carbon Nanotubes on Flat Substrates, J. Am. Chem. Soc., Apr. 22, 2003, p. 5636-5637, 125.

Chin Li Cheung, Andrea Kurtz, Hongkun Park, and Charles M. Lieber, Diameter-Controlled Synthesis of Carbon Nanotubes, J. Phys. Chem. B, 2002, p. 2429-2433, vol. 106, American Chemical Society.

Yiming Li, Woong Kim, Yuegang Zhang, Marco Rolandi, Dunwei Wang and Hongjie Dai, Growth of Single-Walled Carbon Nanotubes from Discrete Catalytic Nanoparticles of Various Sizes, J. Phys. Chem. B., 2001, p. 11424-11431, vol. 105, American Chemical Society.

Lei An, Jessica M. Owens, Laurie E. McNeil, and Jie Liu, Synthesis of Nearly Uniform Single-Walled Carbon Nanotubes Using Identical Metal-Containing Molecular Nanoclusters as Catalysts, Jun. 27, 2002, p. 1-2, 6.

Philip G. Collins, Michael S. Arnold, and Phaedon Avouris, Engineering Carbon Nanotubes and Nanotube Circuits Using Electrical Breakdown, Apr. 27, 2001, p. 706-709, vol. 292, Science, www.sciencemag.org.

Paul L. McEuen, Michael S. Fuhrer, and Hongkun Park, Single-Walled Carbon Nanotube Electronics, Mar. 2002, p. 78-85, vol. 1, No. 1, IEEE Transactions on Nanotechnology.

P.-E. Roche, M. Kociak, M. Ferrier, S. Guéron, A. Kasumov, B. Reulet, and H. Bouchiat, Shot Noise in Carbon Nanotubes, Invited Papers, 2003, p. 104-115, vol. 5115, Proceedings of SPIE, Noise and Information in Nanoelectronics, Sensors, and Standards.

D. S. Bethune, C. H. Klang, M. S. de Vries, G. Gorman, R. Savoy, J. Vazquez and R. Beyers, Cobalt-Catalysed Growth of Carbon Nanotubes with Single-Atomic-Layer Walls, Nature, Jun. 17, 1993, p. 605-607, vol. 363, Letters to Nature.

C. Journet, W. K. Maser, P. Bernier, A. Loiseau, M. Lamy De La Chapello, S. Lefrants, P. Denlard, R. Lee and J. E. Fischer, Large-scale production of single-walled carbon nanotubes by the electric-arc technique, Nature, Aug. 21, 1997, p. 756-757, vol. 388, Letters of Nature.

Brinda B. Lakshmi and Charles R. Martin, Enantioseparation Using Apoenzymes Immobilized in a Porous Polymeric Membrane, Nature, Aug. 21, 1997, p. 758, vol. 388, Letters of Nature.

Andreas Thess, Roland Lee, Pavel Nikolaev, Hongjie Dai, Pierre Petit, Jerome Robert, Chunhui Xu, Young Hee Lee, Seong Gon Kim, Andrew G. Rinzler, Daniel T. Colbert, Gustavo E. Scuseria, David Tománek, John E. Fischer, and Richard E. Smalley, Crystalline Ropes of Metallic Carbon Nanotubes, Science, Jul. 26, 1996, p. 483-487, vol. 273.

Noise Analysis, Diode Mixer Theory, p. 135-142, vol. 135.

Millimeter Frequency Conversion Using Au-$n$-Type GaAs Schottky Barrier Epitaxial Diodes with a Novel Contacting Technique, Manuscript, Oct. 22, 1965, p. 2130-2131.

* cited by examiner

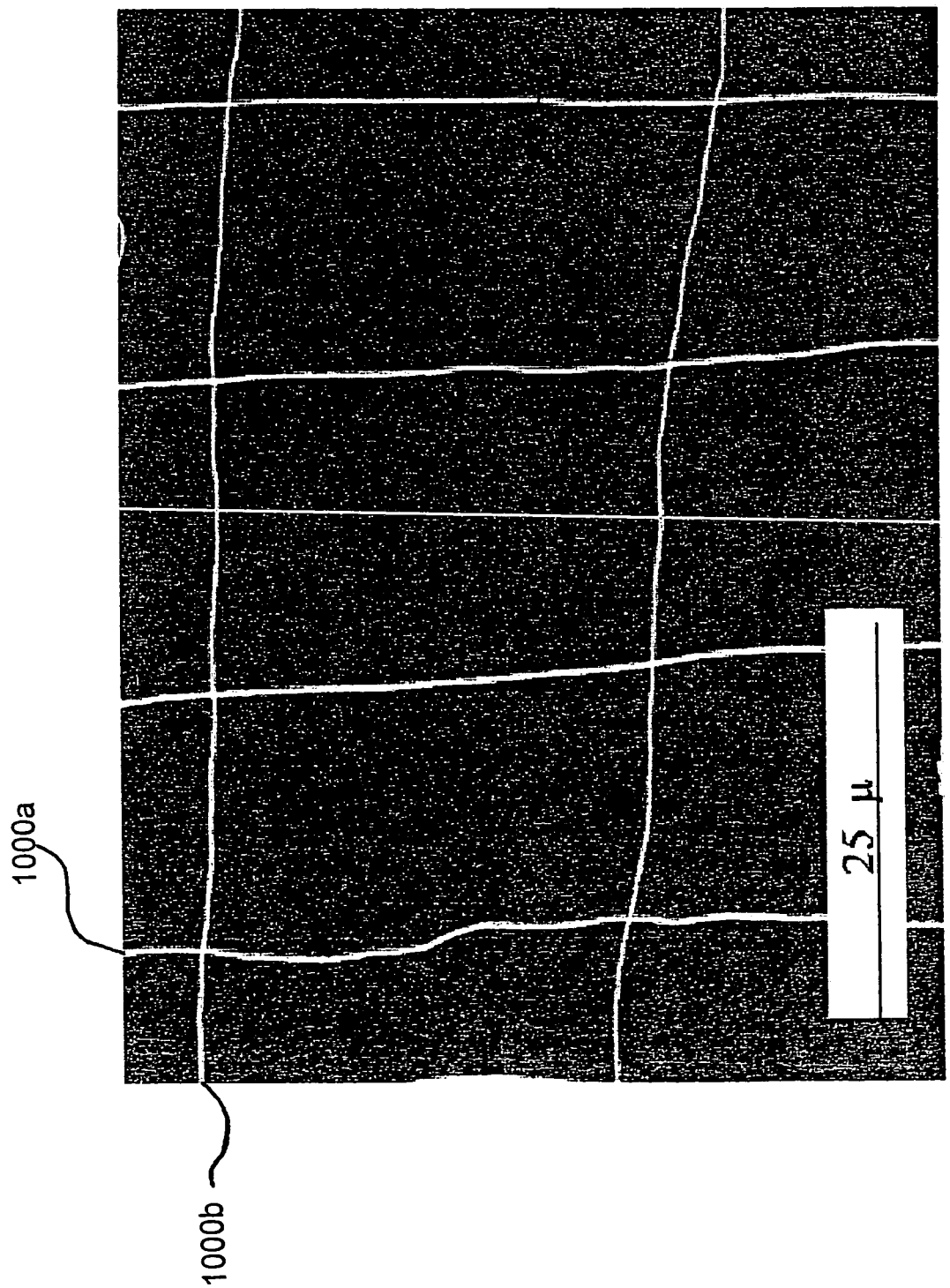

To avoid resistive losses, the LO will be broadcast to the focal plane array as vertically polarized radiation.

CARBON NANOTUBE DEVICES AND METHOD OF FABRICATING THE SAME

BACKGROUND OF THE INVENTION

1. Field of the Invention

The present invention relates generally to radio frequency (RF) devices, and more particularly, the present invention relates to high frequency detectors, mixers and downconverters that utilize carbon nanotube technology.

2. Description of the Related Art

Carbon nanotubes were discovered in the early 1990s as a product of arc-evaporation synthesis of fullerenes. Scientists have since determined that carbon nanotubes have extraordinary physical characteristics, and their potential use in many different applications has attracted much attention. For example, single-wall carbon nanotubes have high-current density and low capacitance characteristics. However, no commercially viable electronic applications for nanotube technologies have been available until very recently.

Thus, there is a need for new and improved products based upon carbon nanotube technology.

SUMMARY OF THE INVENTION

This invention provides novel systems and methods utilizing nanotube diode technology. According to one embodiment of the present invention, a radio frequency (RF) mixer is provided that includes a RF input and at least two carbon nanotube diodes coupled with said RF input.

According to another embodiment of the present invention, a RF mixer includes a diode quad including first, second, third and fourth carbon nanotube diodes. Each carbon nanotube diode includes a p-n junction. The mixer also includes a RF input coupled to each of said diodes and a local oscillator input coupled with each of said diodes.

According to another embodiment of the present invention, a diode quad is provided which includes a substrate, and first and second electrodes formed on the surface of the substrate and separated by a first gap. Second and third electrodes are formed on the surface of the substrate and separated by a second gap. A portion of the second and third electrodes is formed in the first gap. A first p-n junction carbon nanotube diode connects the first electrode with the third electrode. A second p-n junction carbon nanotube diode connects the first electrode with the fourth electrode. A third p-n junction carbon nanotube diode connects the second electrode with the third electrode. A fourth p-n junction carbon nanotube diode connects the second electrode with the fourth electrode.

According to another embodiment of the present invention, a scanner can be provided with an array of carbon nanotube mixers. The scanner may include a plurality of mirrors for focusing an optical input onto the array and a processing means, such as a circuit, for processing the output of the array. The array may be, for example, an array of nanotube diode quads, each representing a pixel of resolution.

Further applications and advantages of various embodiments of the present invention are discussed below with reference to the drawing figures.

BRIEF DESCRIPTION OF THE DRAWINGS

FIG. 10 is an image of crossed nanotubes grown on a substrate;

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

Carbon nanotubes may be fabricated by a variety of methods. The most significant type of carbon nanotube is the single walled nanotube (SWNT). SWNTs can currently be grown up to 10 mm in length and can have either metallic or semiconductor characteristics. That is, depending on orientation of a carbon nanotube's crystal walls, carbon nanotubes may take on metallic characteristics or semiconductor characteristics. Carbon nanotubes (CNT) are referenced throughout this document as either metallic CNTs or semiconductor CNTs to reflect their characteristics.

Semiconductor CNTs may be selectively doped to form p-n junctions. One process for doping a CNT is called dip-pen nanolithography. In this process, a dopant is precisely sprayed ("painted") onto a nanotube with an Atomic Force Microwave (AFM) probe to form a p-n junction.

Figure 7:
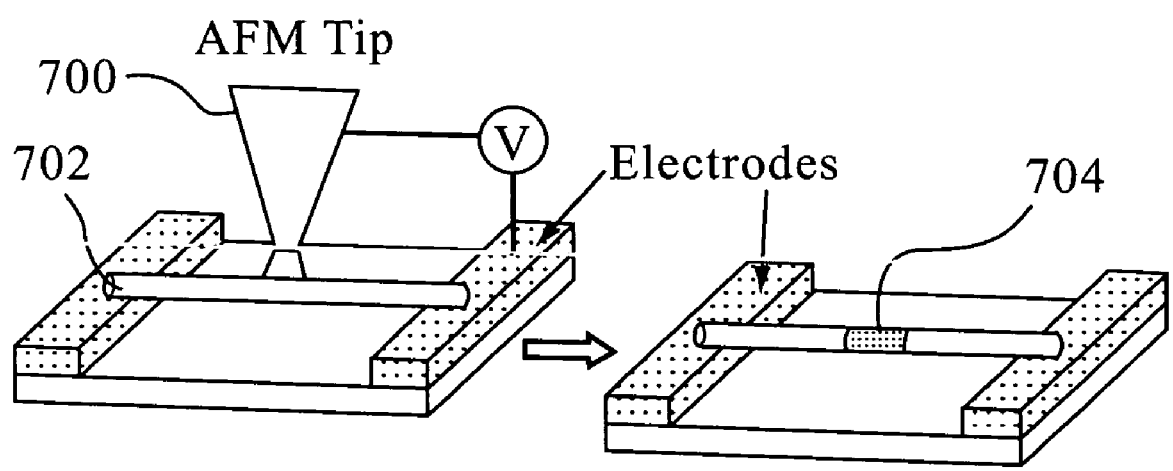
FIG. 7 is a diagram illustrating a method of doping a carbon nanotube.

FIG. 7 shows a carbon nanotube being selectively doped through dip-pen nanolithography. The AFM probe tip 700 is dipped in an electron donor, such as a chemical solution of aniline and polyethaline imide (PEI) or diazonium salts. The AFM 700 is then used to precisely paint carbon nanotube 702 in a selected region to change the selected region of the CNT from p-type to n-type, and as a result, creates the p-n junctions 704.

Doped CNTs have extremely good characteristics for use in RF devices. The capacitance of a single CNT having a p-n junction has been measured at 1 aF ($10^{-18}$ F). However, the impedance of a single nanotube can be too high to use at THz (Terahertz) frequencies, so diodes are preferably built from an array of doped nanotubes. Preferably at least ten nanotubes are utilized per diode, and more preferably, at least 100 nanotubes are used (using about 100 CNTs will reduce the diode impedance to 65Ω which is sufficiently low enough to permit coupling with THz frequency circuits).

Figure 8:
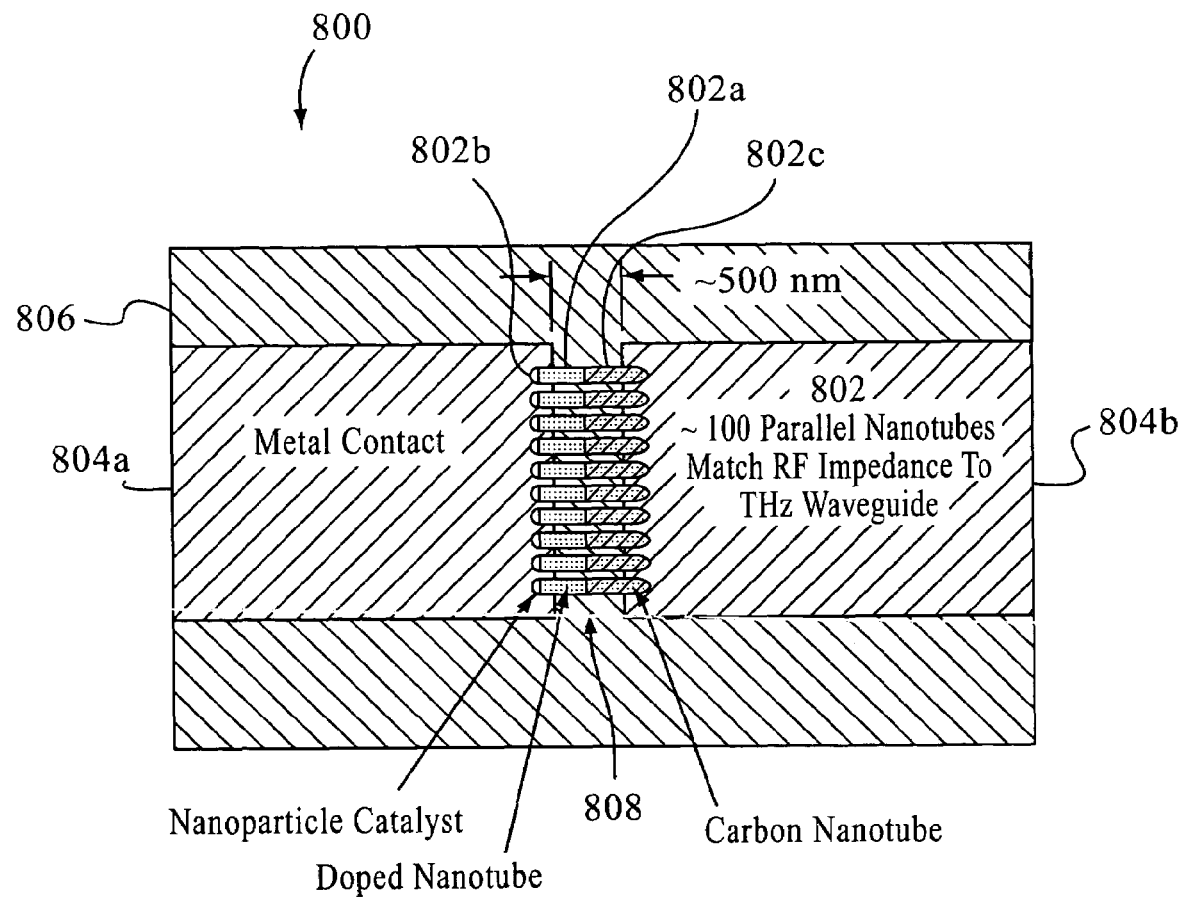
FIG. 8 is a diagram of a diode formed with an array of carbon nanotubes

Referring to FIG. 8, a diode 800 may include an array of doped nanotubes 802 that span a gap 808 between two metal contacts (electrodes) 804a, b, formed on a substrate 806. Each nanotube in the array 802 includes a doped portion 802a, a catalyst 802b and an undoped portion 802c.

The low capacitance of CNT p-n junctions, combined with a resistance of about 6.5 kΩ, enables CNT diodes like the one shown in FIG. 8, to operate at frequencies in the Terahertz (THz) range—currently up to about 25 THz. Further, CNT p-n diodes can be turned-ON with a low turn-on current in the range of 7-8 nA. This low turn-on current translates into low local oscillator (LO) power requirements. As a result, CNT diode based mixers can operate on as low as 2 nW of LO power.

The low turn-on current also means very little detectable Shot noise and low flicker noise at room temperature. For example, a CNT diode based mixer fabricated with about 800 individual nanotubes will require about 200 nW of LO (Local Oscillator) power, which is about 37 dB less than conventional Schottky diode based mixers. Flicker noise (1/f noise) is only significant at frequencies below 10 kHz. This means that the primary noise source is thermal noise. Lack of Shot noise and low flicker noise means that the noise temperature of a CNT diode approaches the operating temperature. The CNT diode based mixers can operate in THz frequencies with a noise temperature of about 600 K, which is highly sensitive, compared to the 5,000 K noise temperature of Schottky diode mixers. Thus, CNT based receivers can approach the performance of the best cryogenic systems while operating at room temperature.

Aligned nanotubes may be grown up to several mm in length by a unique "fast heating" chemical vapor deposition (CVD) method. See, for example, Huang, S., et al., "Growth of Millimeter—long and horizontally Aligned Single Walled Carbon Nanotubes on Flat Sutstrates," *J. Am. Chem. Soc.* (2003), 125, 5636-37, the contents of which are hereby incorporated by reference.

SWNTs can be grown from a catalyst defined on metal contact pads. The pads can be shaped by e-beam lithography and connected to macroscopic photolithographically defined coupling structures and electrodes. The alignment of the nanotubes can be controlled by the CVD gas flow direction and/or the electric field direction. The SWNT length can be grown to be less than ~700 nm, which is the ballistic length of a CNT, and the contact pads may have minimum feature sizes 250 nm.

The alignment criterion for a single nanotube in a diode array is that it should grow over the second pad so that contact can be made. The major alignment criterion for nanotube arrays is that they remain separate, i.e., do not contact or cross over adjacent nanotubes. Bent nanotubes are not expected since the nanotubes are short in length, but misorientation can result from gas turbulence, electric field fringing effects, or other factors. The tolerable misalignment and/or bending will depend on the spacing between the nanotubes.

Figure 9A:
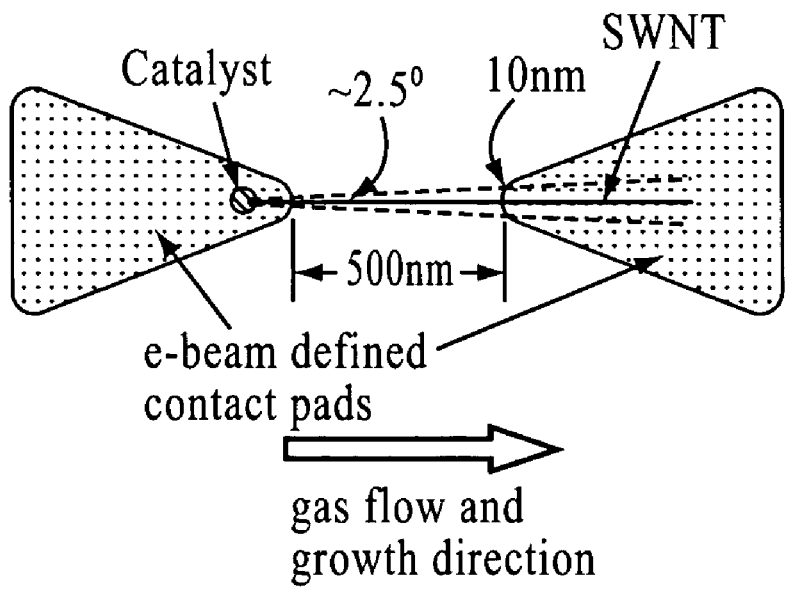
FIGS. 9a-c are illustrations of carbon nanotubes grown across a gap to form a diode.
Figure 9B:
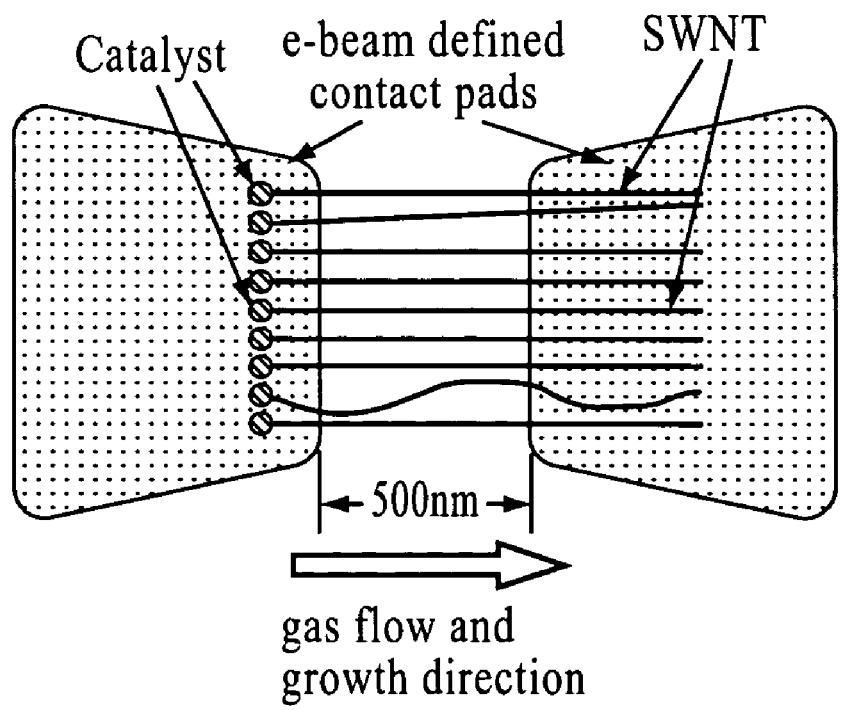
Figure 9C:
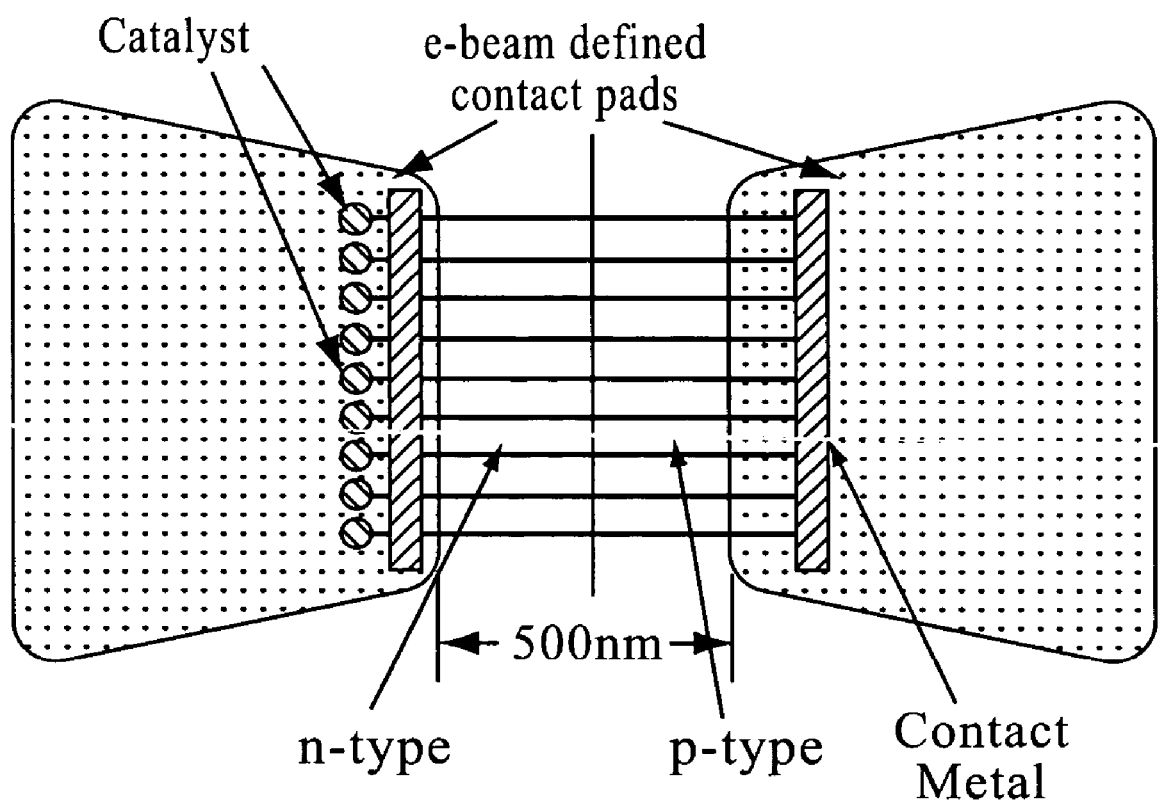

In example the example shown in FIGS. 9a-9c, a 500 nm length of free nanotube is shown and has a deviation in alignment of ±2.5° that would be tolerable. Rounding of the contact pad corners at a larger radius would allow for larger alignment deviations, however at the expense of increased capacitance between the two contact pads. By utilizing the technique, RF devices may be manufactured and such devices are described in further detail below.

Figure 1A:
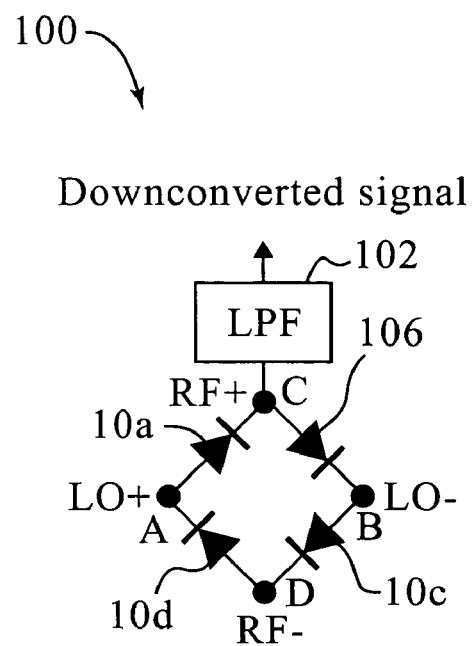
FIG. 1a is a diagram of a four diode quad arrangement for a downconverter.
Figure 1B:
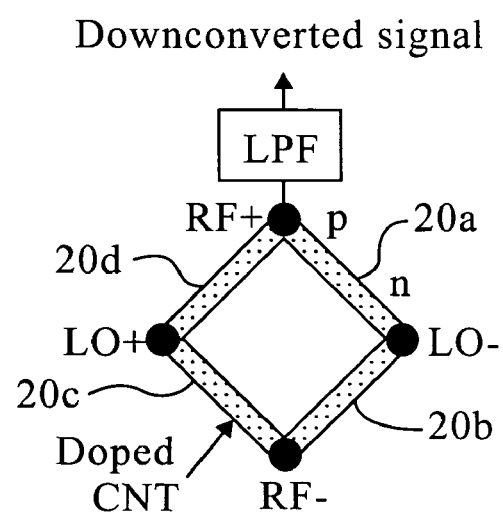
FIG. 1b is a diagram of a downconverter utilizing carbon nanotubes according to an embodiment of the present invention.

Referring to FIG. 1a, a conventional diode quad for a downconverter 100 is shown. Four diodes 10a-10d, typically Schottky diodes, comprise the diode quad in a standard double balanced mixer. A local oscillator (LO) signal (not shown) is input into nodes A and B to switch ("pump") the diodes ON and OFF. A RF signal is input into nodes C and D, which is output to a Low Pass Filter (LPF) 102 as a downconverted signal. LPF 102 is preferably set to cut-out frequencies for translating microwave-optical frequencies to RF. Thus, the LPF 102 may be set at 10-20 GHz Referring to FIG. 1b, a diode quad can be fabricated with the nanotube technology described above. First, four carbon nanotube diodes 20a-d may be grown in an orientation to form the structure similar to the diode quad of FIG. 1a. For example, referring to FIG. 10, crossed nanotubes 1000a, 1000b were grown on successive chemical vapor depositions. The nanotubes 1000a, 1000b were laid down as parallel tubes when the source gases were turned off and the substrate temperature was reduced. The electrodes of a diode quad for a downconverter can be defined on the structure shown in FIG. 10, using electron beam (e-beam) lithography, for example, or by etching. The CNTs may be doped as described above to form the p-n junctions as shown in FIG. 1b.

Figure 2:
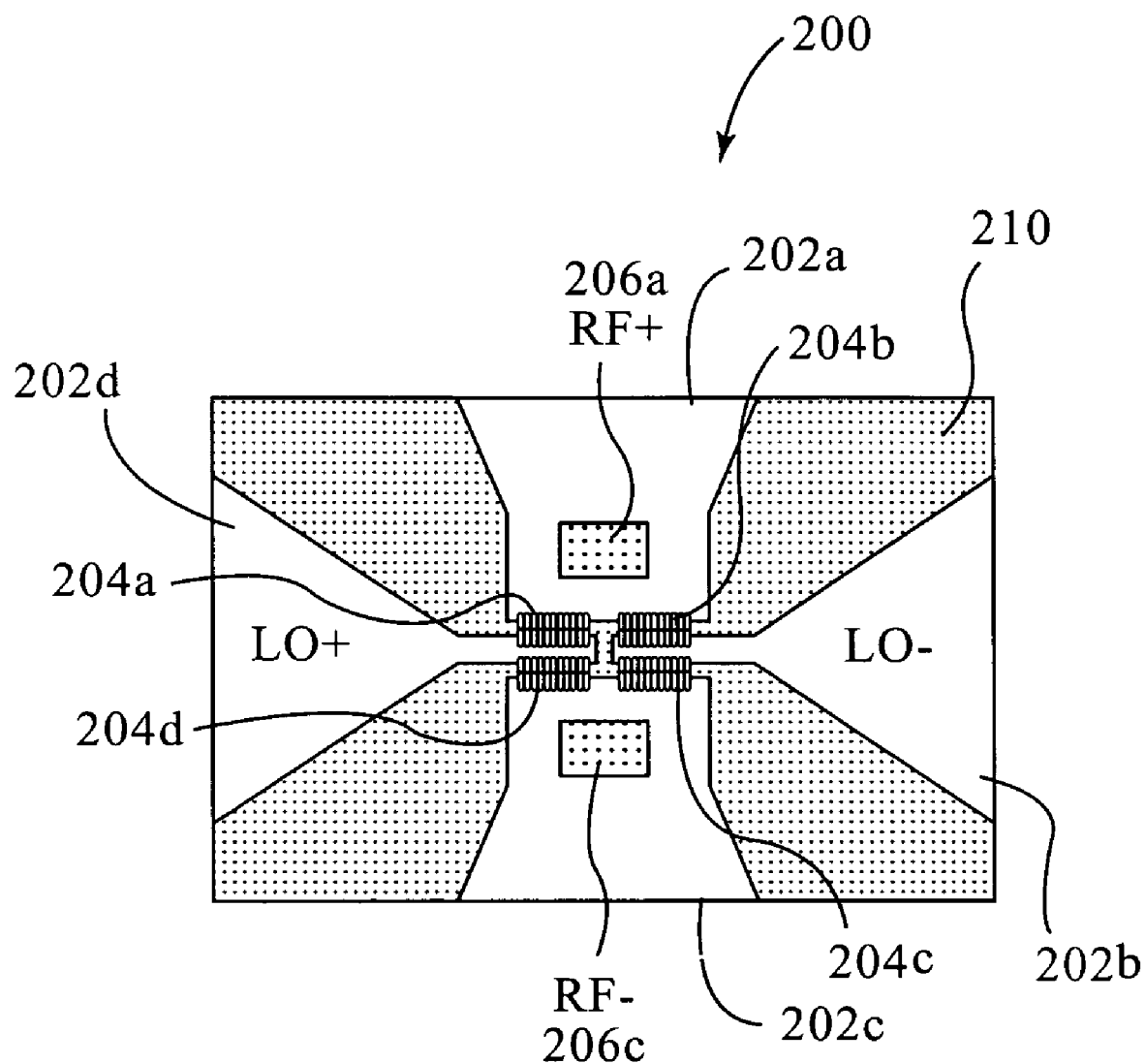
FIG. 2 is a diagram of a diode quad using CNT array diodes.

FIG. 2 shows a diode quad using CNT array diodes. Electrodes 202a-d can be formed on the surface of a substrate 210 and doped, p-n CNT arrays 204a-d are grown over gaps between the electrodes 202a-d. Electrodes 202b and 202d may be used as inputs for the local oscillator (not shown) and vias 206a and 206c may be provided on electrodes 202a and 202c for IF output. The resulting mixer can operate at room temperature while achieving a noise temperature of 1000 K, which approaches the performance of the best cryogenic devices.

Nanotubes may be grown longer than 1 micrometer to minimize parasitic capacitance for high-frequency operation without any additional parasitic resistance. Metallic carbon nanotubes are highly polarizable and have low resistance (i.e., highly conductive), which make metallic carbon nanotubes excellent antennas. According to another embodiment of the present invention, metallic carbon nanotubes may be used as antennae inputs to couple with a circuit.

Figure 3:
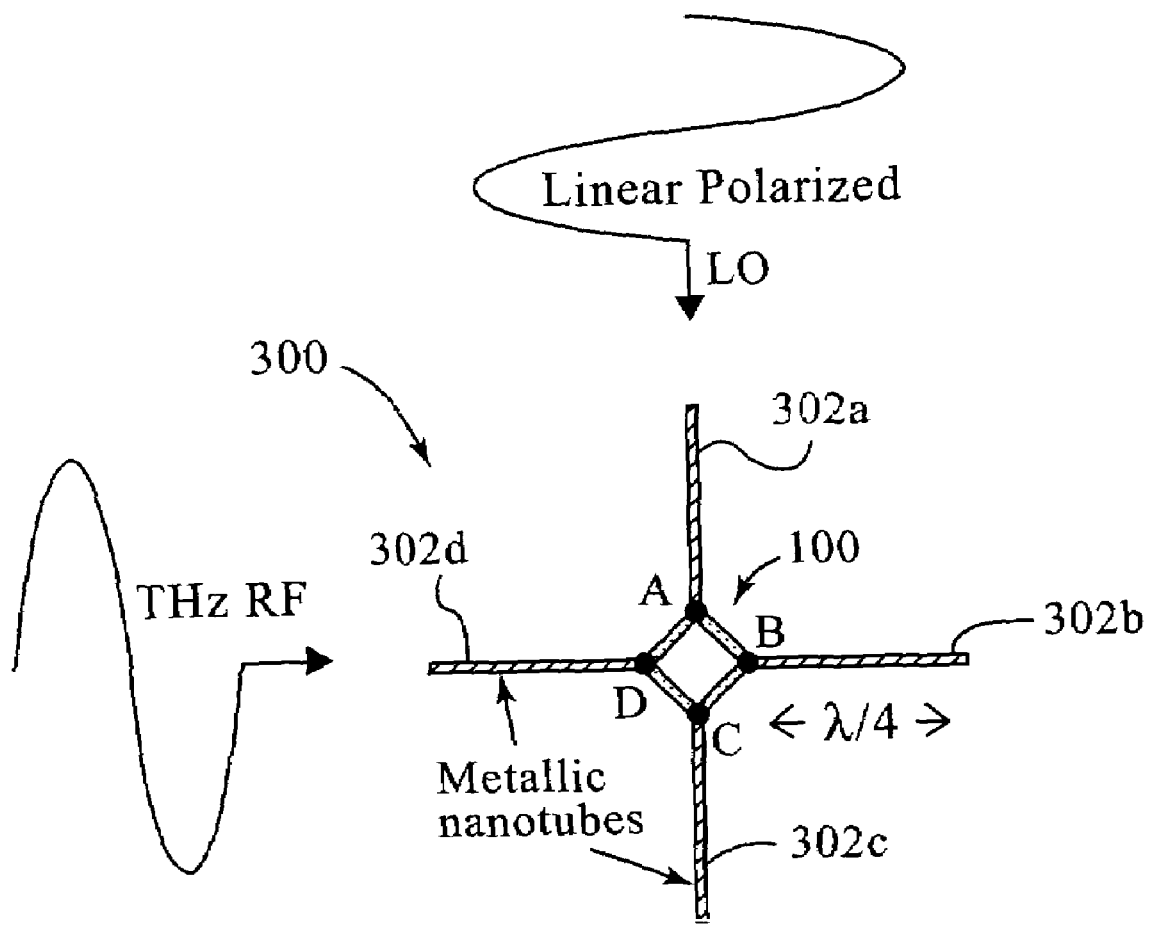
FIG. 3 is a diagram of a quarter-wave antenna utilizing carbon nanotube technology according to an embodiment of the present invention.

Referring to FIG. 3, device 300 includes metallic carbon nanotubes implemented as quarter-wave dipole antennas 302a-d at the corners A-D of a double-balanced diode quad 100, to permit quasi-optic coupling of a radiant local oscillator (LO) to drive the mixer. As shown, a linearly polarized source could illuminate the LO ports, while the RF ports receive the RF signal in the orthogonal polarization.

Figure 5:
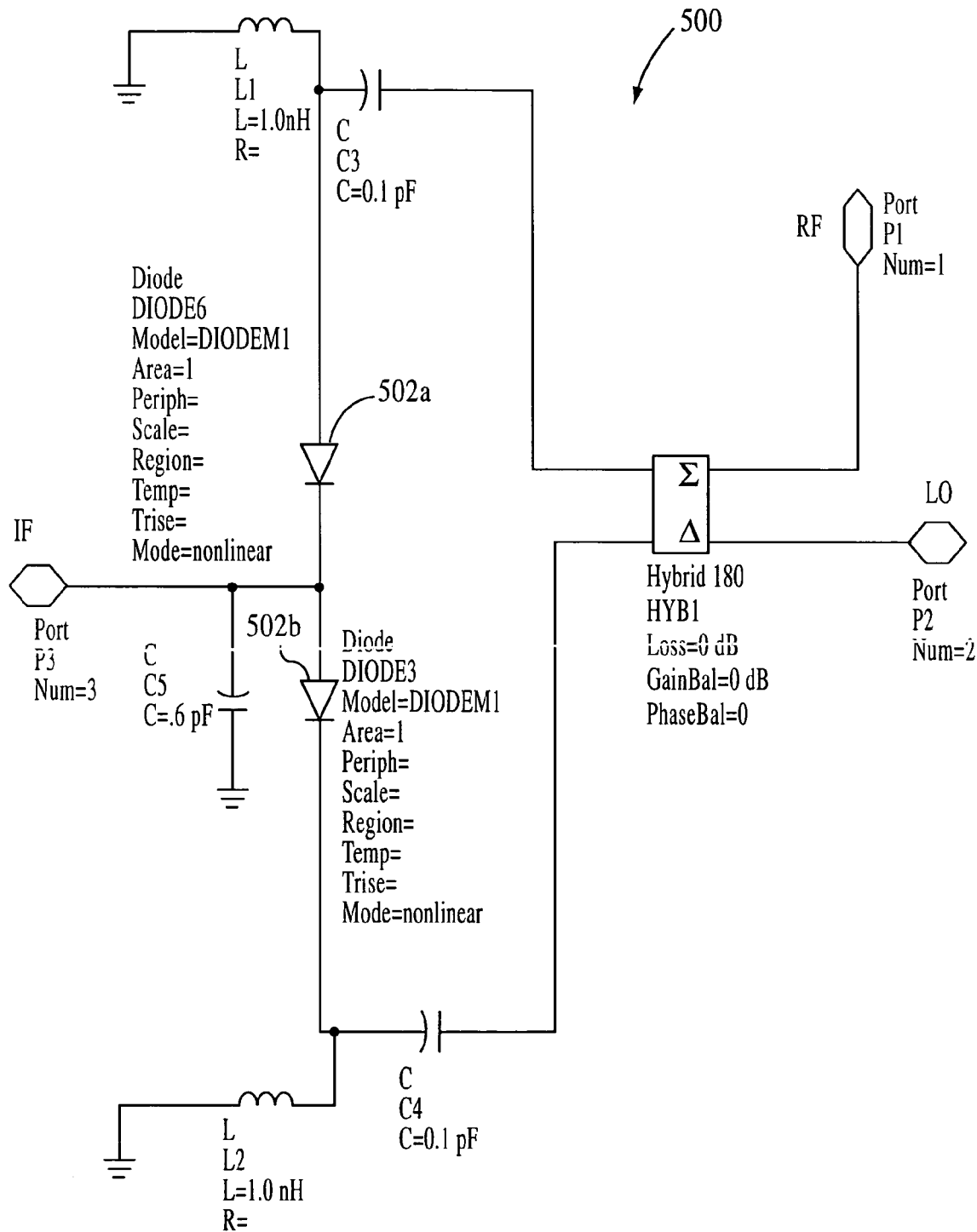
FIG. 5 is a schematic of a balanced mixer.

A schematic of a single balanced mixer 500 is shown in FIG. 5. Like the device of FIG. 3, dipole antenna structures may be used for inputting the RF and LO signals into the mixer 500. Two p-n nanotube diodes 502a and 502b are used to mix the signals to output the downconverted signal as an intermediate frequency (IF) signal.

Single-balanced and double-balanced mixers inherently reject AM noise of the local oscillator used to pump the diodes. As a result, the effective diode noise temperature is lowered, which is critical for millimeter wave mixer applications. The improved sensitivity of CNT detector/downconverters make them very suitable for use in scanning devices and the like. Thus, arrays of CNT detector/downconverters may be fabricated utilizing nanotube technology for use in a number of applications, such as for imaging by line scanning, similar to the imaging technique of a fax machine.

Figure 6:
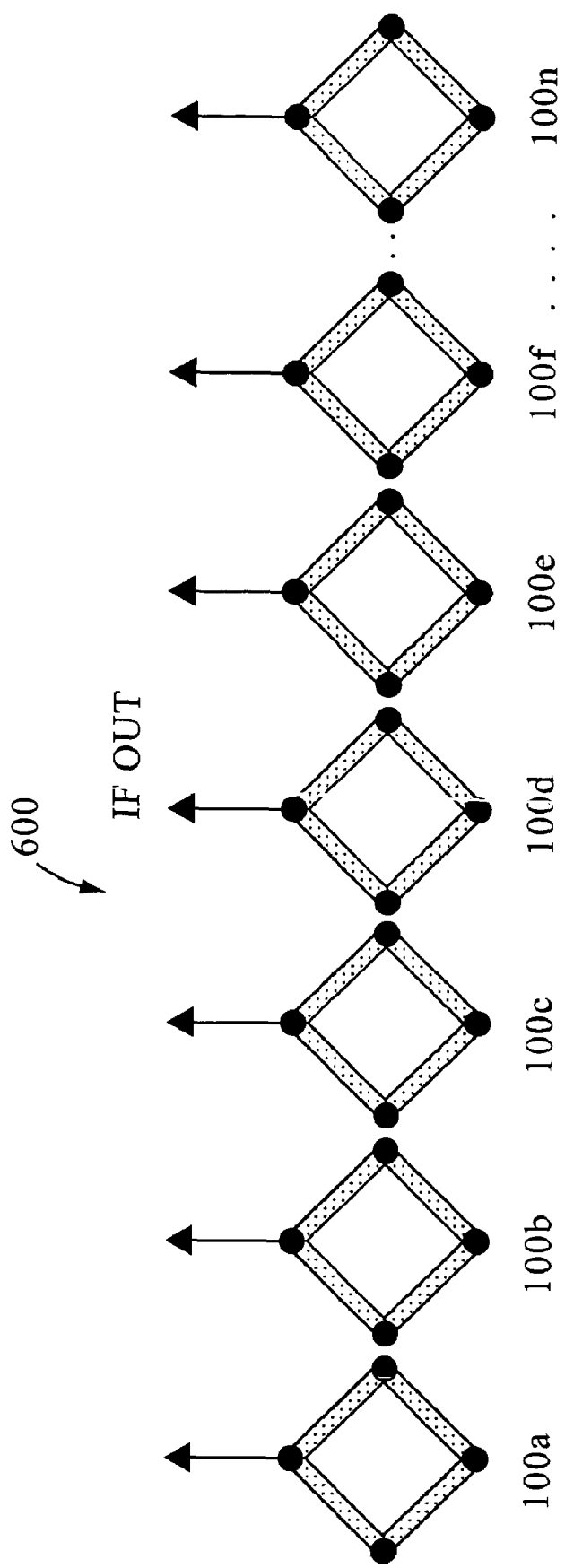
FIG. 6 is a diagram of a linear array detector according to an embodiment of the present invention.

As shown in FIG. 6, a series or array 600 of diode quads 100a-n is fabricated. Optical mirrors could be used to focus an image and scan it across the array 600. Multi-spectral imaging is possible by sweeping the frequency of the LO on successive scans or by using multiple line arrays with different LO's. A collection of mirror gratings could direct the desired LO's onto the various line arrays.

Figure 11:
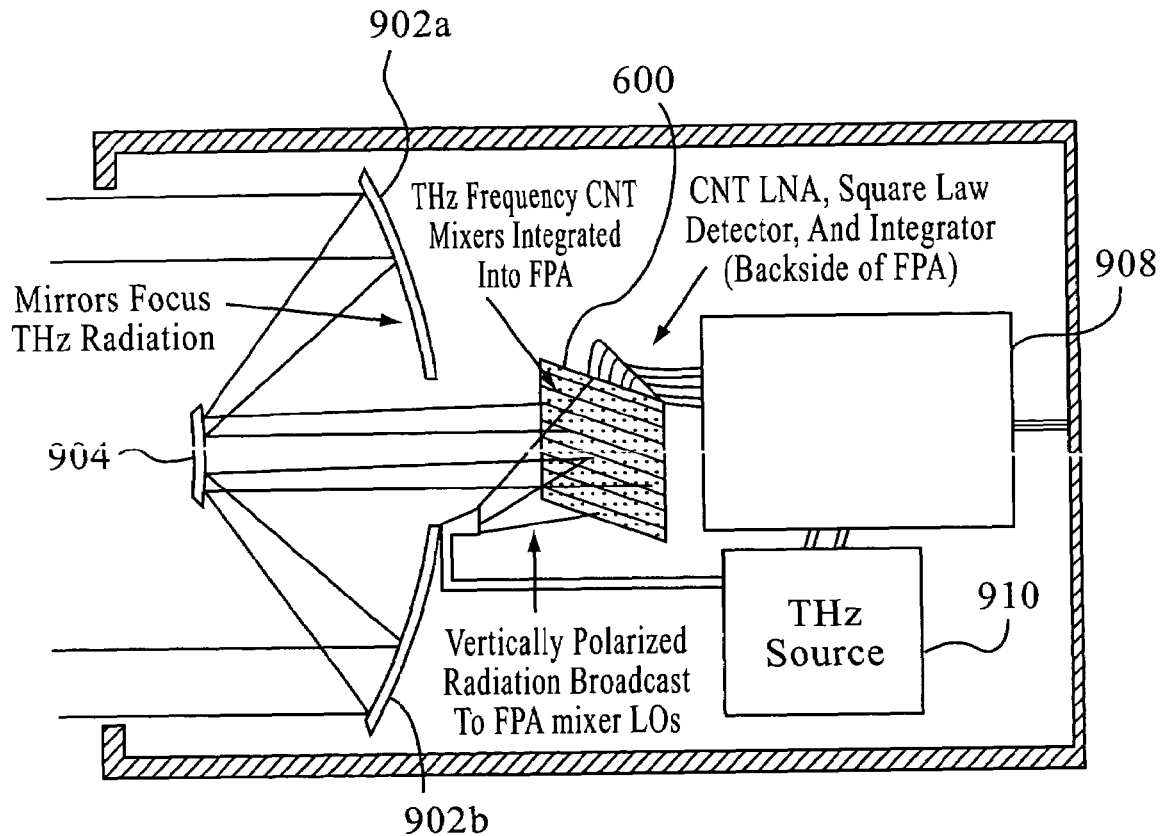
FIG. 11 is a diagram of an imaging device.

The heart of the THz imaging system is the CNT mixer. A CNT based THz imaging system is shown in FIG. 11. A system of mirrors 902a, 902b and 904 can be used to focus the THz energy (e.g., 5 THz) from source 910, onto the focal plane array (FPA) 600. The mirrors can be used to focus an image and scan it across the array. Diffraction limited focusing of a 2 cm spot at 25 m will require an aperture size of 10", for example. The IF signal outputted is processed by means of circuit 908.

An individual pixel of the imaging system will be generated from a single CNT mixer, dipole antennas, and the antenna coupling structures. A vertically polarized LO signal will be broadcast to the FPA 600 from a source mounted in front of the array. A horizontal dipole antenna incorporated into the mixer design can be used to capture the THz signal, while a vertical dipole antenna will capture the LO signal. The downconverted 50 GHz IF signal will be removed from the backside of the FPA 600 amplified, detected, digitized, and processed by circuit 908, shown in more detail in FIG. 4.

Figure 4:
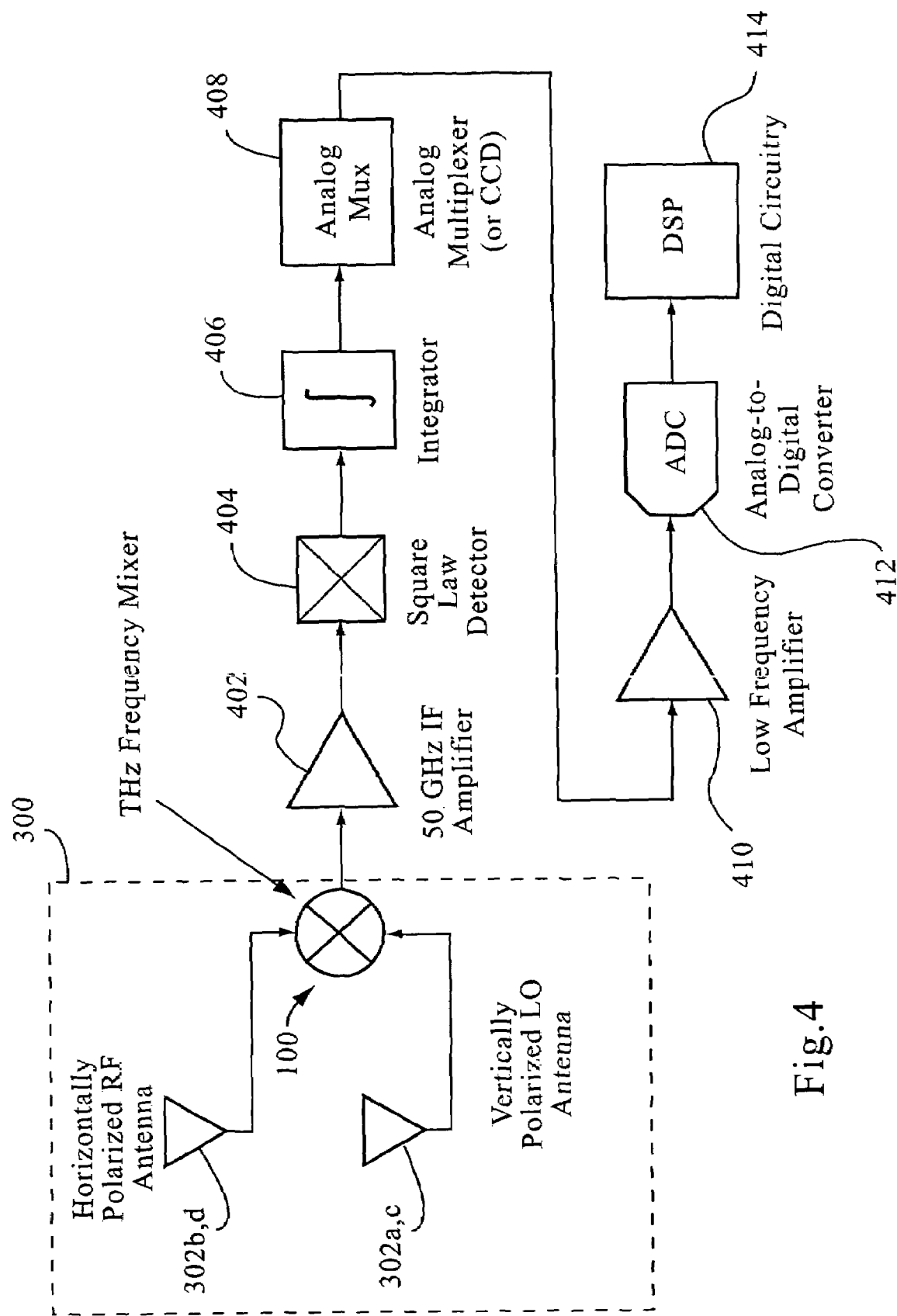
FIG. 4 is a schematic of a pixel processing circuit.

Referring to FIG. 4, the mixer 300 is shown integrated into a pixel chain. The mixer 300 inputs into a IF amplifier coupled with a square law detector 404, an integrator 406, an analog multiplexer 408, a LF amplifier 410, an A/D converter 412, which inputs into digital circuitry 414, which may then construct the image or otherwise process the pixel data.

The primary noise sources for the system will be the THz frequency mixer and the IF amplifier. The CNT diode based mixer will have a noise temperature of about 600 K and a conversion loss of at most 10 dB. Assuming a noise figure of 4 dB for the IF amplifier, the input referred system noise temperature will be about 15,000 K. With an input referred noise temperature of 15,000K, the system will be capable of resolving temperature differences of 1 K with a 10 ms integration time. This is highly sensitive and will make the device suitable for use in scanning luggage, people, etc., such as for airport security or the like.

Figure 12:
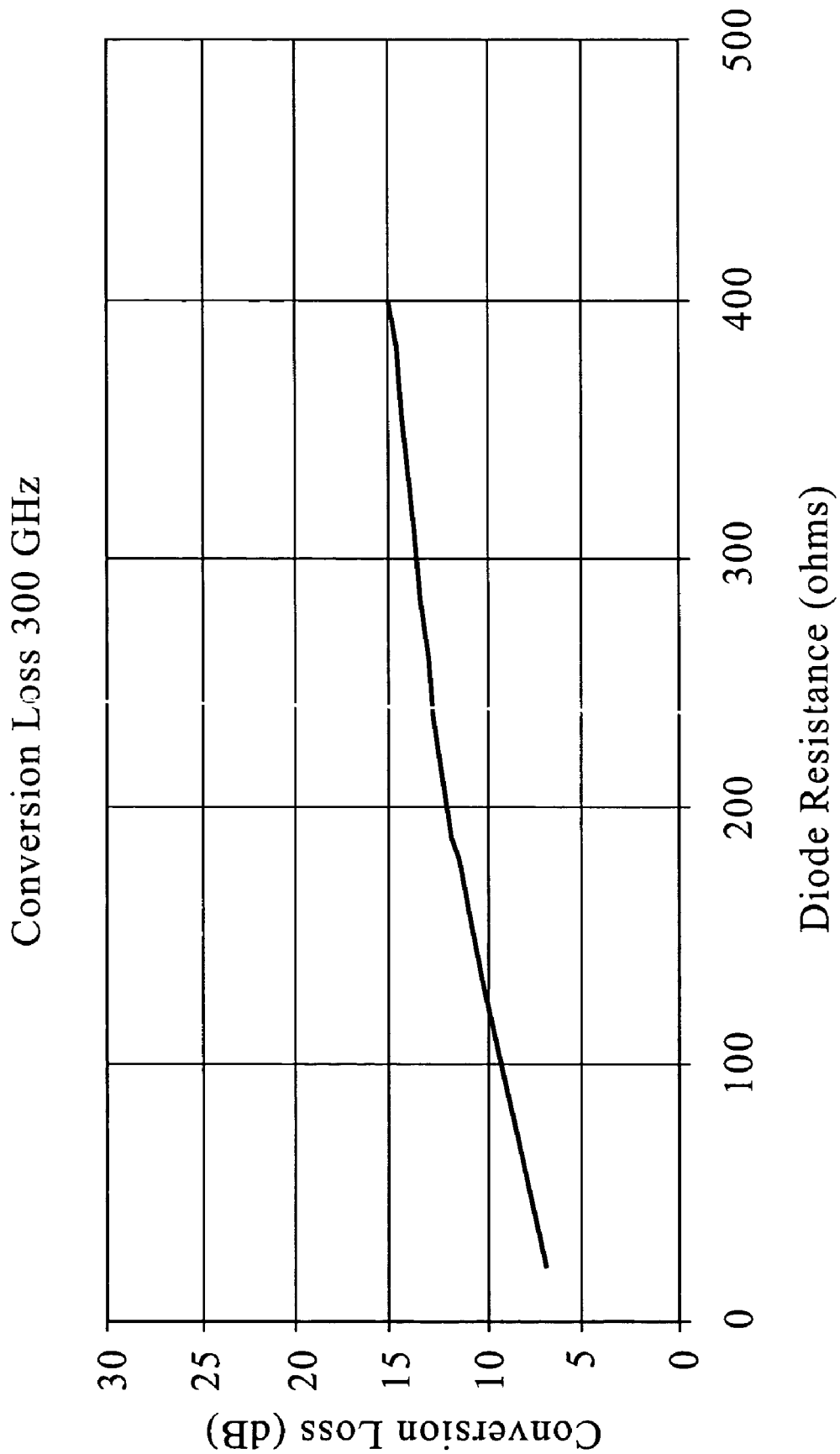
FIGS. 12-13 are graphs of diode conversion loss.
Figure 13:
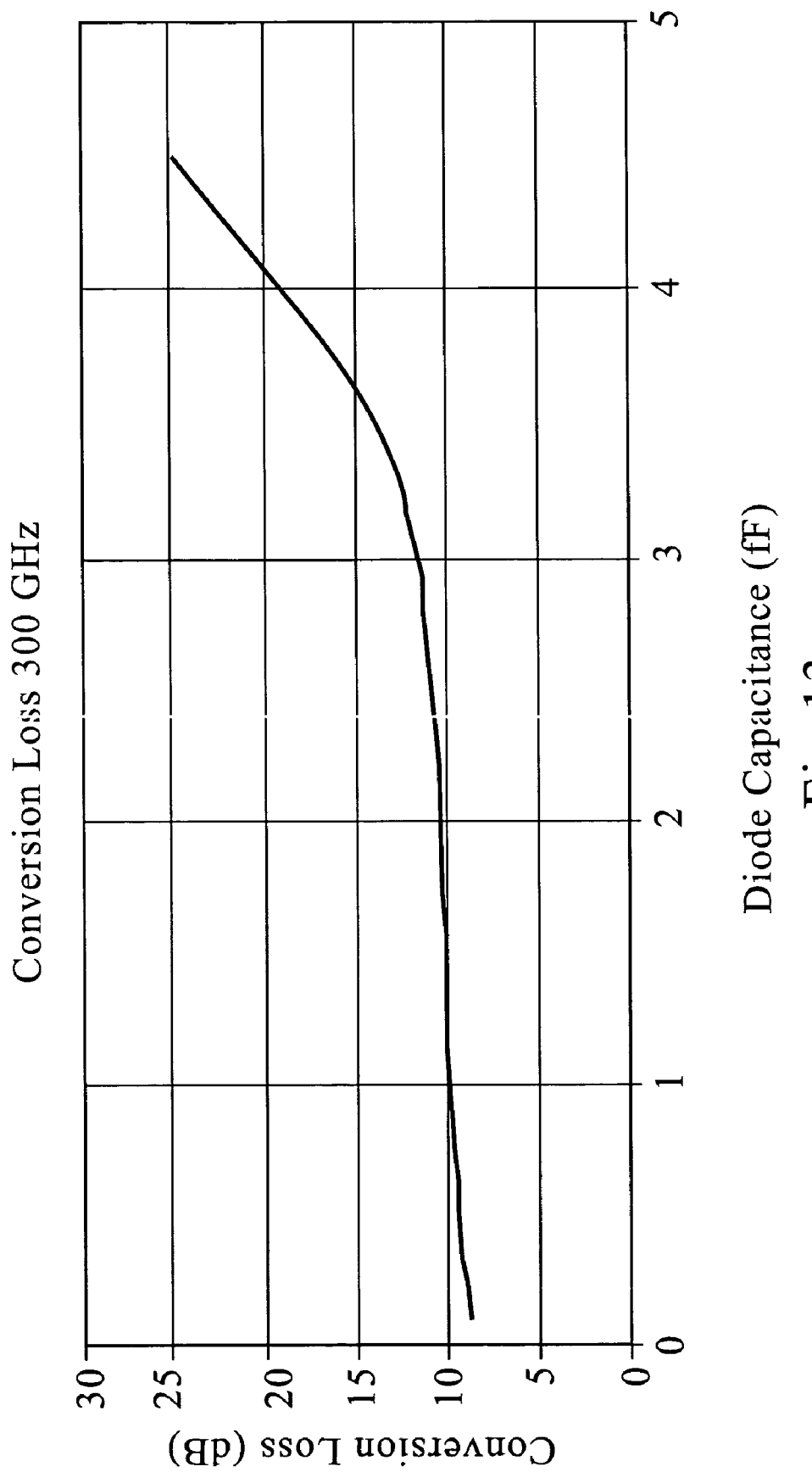

FIG. 12 shows conversion loss versus the diode resistance, and FIG. 13 shows conversion loss versus diode capacitance, for a doped carbon nanotube. At millimeter wave frequency, the diode capacitance needs to be small for optimum performance. Due to extremely small junction area of a carbon nanotube diode, the capacitance will be extremely small. The diode resistance can be decreased by putting multiple junctions in parallel, and by optimizing the junction for low parasitic resistance. Since the nanotube junction is only one atom in thickness, there should be virtually no recombination across the junction, which should lower the diode resistance.

Thus, a number of preferred embodiments have been fully described above with reference to the drawing figures. Although the invention has been described based upon these preferred embodiments, it would be apparent to those of skill in the art that certain modifications, variations, and alternative constructions could be made to the described embodiments within the spirit and scope of the invention.

The following references provide additional information regarding carbon nanotubes and RE devices and the entire contents of which are hereby incorporated by reference:

H. W. C. Postma, T. Teepen, Z. Yao, M. Grifoni, and C. Dekker, Carbon Nanotube Single-Electron Transistors at Room Temperature, *Science* (2001), 293, p. 76;

P. E. Roche, M. Kociak, M. Ferrier, S. Gueron, A. Kasumov, B. Reulet, and H. Bouchiat, Shote Notice in Carbon Nanotubes, *Proceedings of SPIE* (2003), 5115, p. 104;

S. A. Mass, *Microwave Mixers*, (Boton: Archer House, 1993), p. 135-142;

M. I. Skolnik, The Radar Handbook, (New York, McGraw-Hill, 1970), p. 39-1-39-36;

B. Nabet, et al., "Local Variation of Metal-Semiconducting Carbon Nanotube Contact Barrier Height," Proceedings of the 2002 2$^{nd}$ IEEE Conference on Nanotechnology, 26-28 Aug. 2002, Pages 435-438;

A. S. Vedeneev et al "Molecular-scale rectifying diodes based on Y-junction carbon nanotubes," 1999 International Electron Devices Meeting, IEDM Technical Digest, 5-8 Dec. 1999, Pages 231-233;

P. H. Siegel, "Terahertz Technology," IEEE Trans MTT-50, 910-28, 2002;

Ph. Avouris et al., "Carbon Nanotube Electronics," IEEE Proc. 91, 1772-84, 2003;

P. J. Burke, "Luttinger Liquid Theory as a Model of the Gigahertz Electrical Properties of Carbon Nanotubes," IEEE Trans on Nanotechnology, 1, 129-44, 2002;

I. Mehdi et al, "600 GHJz planar-Schottky-diode subharmonic waveguidfe mixers," IEEE MIT-S Int. Microwave Symp., San Francisco, Calif., 1996, Paper TU4-E3;

M. S. Shur and J-Q. Lu, "Terahertz Sources and Detectors Using Two-Dimensional Electronic Fluid in High Electron-Mobility Transistors," IEEE Trans. MIT-48, 750-6, 2000;

A. Rahman et al., "Theory of Ballistic Nanotransistors," IEEE Trans. ED-50, 1853-64, 2000;

A. Raychowdhury, S. Mukhopadhyay, K. Roy "Circuit-compatible modeling of carbon nonotube fets in the ballistic limit of performance," IEEE-NANO 2003, Third IEEE Conference on Nanotechnology, Volume 1, 12-14 Aug. 2003, Pages 343k0346. Nanotechnolog;

T. Durkop, S. A. Getty, Enrique Cobas, and M. S. Fuhrer, "Extraordinary mobility in semiconducting carbon nanotubes," Nano Letters, vol. 4, no. 1, pp. 35-39, 2004;

S. Rosenblatt, Y. Yaish, J. Park, J. Gore, V. Sazonova, and P. L. McEuen, "High Performance Electrolyte Gated Carbon Nanotube Transistors," Nano Letters, vol. 2, no. 8, pp. 869-872, 2002;

Bethune, D. S.; Kiang, C. H.; DeVries, M. S.; Gorman, G.; Savoy, R.; Beyers, R. Cobalt-catalysed growth of carbon nanotubes with single-atomic-layer walls, *Nature* (1993), 363, 605;

Journet, C.; Maser, W. K.; Bernier, P.; Loiseau, A; Cahpelle, M. L. d. 1.; Lefrant, S.; Deniard, P.; Lee, R.; Fischer, J. E. Large-scale production of single-walled carbon nanotubes by the electric-arc technique, *Nature* (1997), 388, 756;

Thess, A.; Lee, R.; Nikolaev, P.; Dai, H.; Petit, P.; Robert, J.; Xu, C.; Lee, Y. H.; Kim, S. G.; Rinzler, A. G.; Colbert, D. T.; Scuseria, G. E.; Tomanek, D.; Fischer, J. E.; Smalley, R. E. Crystalline Ropes of Metallic Carbon Nanotubes, *Science* (1996), 273, 483;

Zhang, Y. G.; Chang, A. L.; Cao, J.; Wang, Q.; Kim, W.; Li, Y. M.; Morris, N.; Yenilmez, E.; Kong, J.; Dai, H. J. Electric-field-directed growth of aligned single-walled carbon nanotubes, *Appl. Phys. Lett.* (2001), 79, 3155-3157;

Su, M.; Li, Y.; Maynor, B.; Buldum, A.; Lu, J. P.; Liu, J. Lattice-oriented growth of single-walled carbon nanotubes, *J. Phys. Chem. B* (2000), 104, 656505-6508;

Franklin, N. R.; Dai, H. An Enhanced CVD Approach to Extensive Nanotube Networks with Directionality, *Adv. Mater.* (2000), 12, 890-894;

Huang, S.; Cai, X.; Liu, J. Growth of Millimeter-long and Horizontally Aligned Single Walled Carbon Nanotubes on Flat Substrates, *J. Am. Chem. Soc.* (2003), 125, 5636-5637;

Cheung, C. L.; Kurtz, A.; Park, H.; Lieber, C. M. Diameter-controller synthesis of carbon nanotubes, *J. Phys. Chem. B* (2002), 106, 2429-2433;

Li, Y. M.; Kim, W.; Zhang, Y. G.; Rolandi, M.; Wang, D. W.; Dai, H. J. Growth of single-walled carbon nanotubes from discrete catalytic nanoparticles of various sizes, *J. Phys. Chem. B* (2001), 105, 11424-11431;

Tang, Z. K.; Sun, H. D.; Wang, J.; Chen, J.; Li, G. Mono-sized single-wall carton nanotubes formed in channels of A1PO4-5 single crystal, *Appl. Phys. Lett.* (1998), 73, 2287;

An, L.; Owens, J. M.; McNeil, L. E.; Liu, J. Synthesis of nearly uniform single-walled carbon nanotubes using identical metal-containing molecular nanoclusters as catalysts, *J. Am. Chem. Soc.* (2002), 124, 13688-13689;

P. Collins, M. Arnold and Ph. Avouris, Scient 292, 706 (2001);

P. McEuen, "Single-Walled Carbon Nanotube Electronics," IEEE Trans. Nanotech., I, 78 (2002);

H. Soh, C. Quate, A. Motpurgo, C. Marcos, J. Kong, and H. Dai, Appi. Phys. Lett. 75, 627 (1999);

N. Franklin, Q. Wang, T. Tomblor, A. Javey, M. Shim, H. Dai, Appl. Phys. Len. 81, 913 (2002);

C. Cheung, A. Kurtz, H. Park, C. Lieber, "Diameter-controlled synthesis of carbon nanotubes," J. Phys. Chem. 106, 2429 (2002);

R. S. Lee, J. J. Kim, J. E. Fischer, A.Thess, R. Smalley, "Conductivity enhancement in single-walled carbon nanotube bundles doped with K and Br," Nature, 388, 255 (1997);

M. Bockrath, J. Hone, A. Zenl, P. McEuen, A. Rinzler, R. Smalley, Phys. Rev. B, 61, R10606 (2000);

J. Kong, H. Dai, "Full and Modulated Chemical Gating of Individual CNTs by Organic Amine Compounds," J. Phys. Chem B. 105, 2890 (2001).

V. Derycke, R. Martel, J. Appenzeller, Ph. Avouris, Nano Letters, 1, 453 (2001);

C. Zhou, J. Kong, E. Yenilmez, H Dai, Science, 290, 1552 (2000).

P. H. Siegel, "THz Technology," IEEE Transactions on Microwave Theory and Techniques, Vol. 50 (3), pp. 910-928, March 2002;

D. T. Young and J. C. Irwin, "Millimeter frequency conversion using Au-n-type GaAs Schottky barrier epitaxial diodes with a novel contacting technique," Proc. IEEE, vol. 53, no. 12, pp. 2130-31, December 1965;

M. C. Gaidis, H. M. Pickett, C. D. Smith, R. P. Smith, S. C. Martin and P. H. Siegel "A 2.5 THz Receiver Front-End for Spaceborne Applications," IEEE Transactions Microwave Theory and Techniques, vol. 48, no. 4, pp. 733-739, April 2000;

Mehdi, T. Lee, D. HJumphrey, S. Martin, R. J. Dengler, J. E. Oswald, A. Pease, R. P. Smith and P. H. Siegel, "600 GHz Planar-Schottkey-Diode Subharmonic Waveguide Mixers," 1996 IEEE MTT-S Int. Microwave Symposium, San Francisco, Calif., paper TU4-E3, Jun. 17-21, 1996;

S. J. Tans, R. M. Verschueren, C. Dekker, *Nature* 393, 49 (1998).

R. Martel, T. Schmidt, H. R. Shea, T. Hertel, P. Avouris, *Applied Physics Letters* 73, 2447 (1998);

T. Durkop, S. A. Getty, E. Cobas, M. S. Fuhrer, *Nano Letters* 4, 35 (2004);

A. Javey, J. Guo, Q. Wang, M. Lundstrom, H. J. Dai, *Nature* 424, 654 (Aug. 7, 2003);

Y. Yaish et al., published online at http://lxxx.lanl.gov/abs/cond-mat0305108) (2003); and D. H. Cobden, M. Bockrath, P. L. McEuen, A. G. Rinzler, R. E. Smalley, *Physical Review Letters* 81, 681 (1998).

We claim:

1. A diode quad comprising:
   a substrate;
   first and second electrodes formed on the surface of said substrate and separated by a first gap;
   fourth and third electrodes formed on the surface of the substrate and separated by a second gap, a portion of said fourth and said third electrodes being formed in said first gap;
   a first p-n junction carbon nanotube diode connecting said first electrode with said third electrode;
   a second p-n junction carbon nanotube diode connecting said first electrode with said fourth electrode;
   a third p-n junction carbon nanotube diode connecting said second electrode with said third electrode; and
   a fourth p-n junction carbon nanotube diode connecting said second electrode with said fourth electrode.

2. The diode quad as recited in claim 1, wherein said first and second electrodes are RF inputs to said diode quad.

3. The diode quad as recited in claim 1, wherein said third and fourth electrodes are local oscillator inputs to said diode quad.

4. The diode quad as recited in claim 1, wherein the p-side of said first diode is coupled with said third electrode, the p-side of said second diode is coupled with said first electrode, the p-side of said third diode is coupled said fourth electrode, and the p-side of said fourth diode is coupled with said second electrode.

5. The diode quad as recited in claim 1, further comprising first, second, third and fourth metallic nanotube antennas connected to said first, second, third, and fourth electrodes respectively.

6. The diode quad as recited in claim 1, wherein each said diode comprises at least one semiconductor single wall carbon nanotube, each said nanotube having a section thereof selectively doped to form a p-n junction.

7. The diode quad as recited in claim 1, wherein each said diode includes doped nanotube arrays.

8. The diode quad as recited in claim 7, wherein each doped nanotube arrays includes at least 10 doped carbon nanotubes.

9. The diode quad as recited in claim 7, wherein each doped nanotube arrays includes at least 100 doped carbon nanotubes.

* * * * *